United States Patent
Fukui et al.

(10) Patent No.: US 7,576,595 B2
(45) Date of Patent: Aug. 18, 2009

(54) BUFFER CIRCUIT

(75) Inventors: Eizo Fukui, Tokyo (JP); Kouzou Ichimaru, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/183,429

(22) Filed: Jul. 18, 2005

(65) Prior Publication Data
US 2006/0164133 A1     Jul. 27, 2006

(30) Foreign Application Priority Data
Jul. 30, 2004   (JP)   ............... 2004-222914

(51) Int. Cl.
*G05F 1/10* (2006.01)
(52) U.S. Cl. ................... 327/538; 327/539
(58) Field of Classification Search ............. None
See application file for complete search history.

(56) References Cited
U.S. PATENT DOCUMENTS 5,874,858 A * 2/1999 Furuya .............. 330/273
6,064,274 A * 5/2000 Nayebi et al. .......... 331/17
6,271,716 B1 * 8/2001 Nayebi et al. ........ 327/538
7,098,720 B1 * 8/2006 Dow ................... 327/513
7,221,217 B2 * 5/2007 Choi et al. ............. 330/98
2004/0095198 A1 * 5/2004 Yeh ................. 331/117 R

* cited by examiner

*Primary Examiner*—Tuan Lam
*Assistant Examiner*—Hiep Nguyen
(74) *Attorney, Agent, or Firm*—John J. Patti; Wade J. Brady, III; Frederick J. Telecky, Jr.

(57) ABSTRACT

The objective of the present invention is to present a buffer circuit by which a load can be driven at a high speed while restraining an increase in power consumption. A current input to npn transistor Q1 via node N1 is detected by current detection circuit 1. At bias control circuit 2, base voltage of npn transistor Q2 is regulated in such a manner that the current of npn transistor Q2 decreases in accordance with an increase in said detected current, and the current of npn transistor Q2 increases in accordance with a decrease in the detected current. As a result, because transient current which can flow to the load can be increased, even when load capacitor CL has a large capacitance or when the frequency is high, the output voltage can quickly follow a change in the input voltage, so that distortion of the output voltage waveform can be restrained.

7 Claims, 5 Drawing Sheets

BUFFER CIRCUIT

CROSS REFERENCE TO RELATED APPLICATIONS

This application claims priority under 35 USC § 119 of Japanese Application Serial No. 2004-222,914, filed Jul. 30, 2004.

FIELD OF THE INVENTION

The present invention pertains to a buffer circuit of, for example, an emitter follower circuit.

BACKGROUND OF THE INVENTION

High input impedance and low output impedance are characteristic of an emitter follower circuit. Also, because it has a large current gain, it is widely utilized as a buffer circuit for driving a capacitive load.

FIG. 9 and FIG. 10 show examples of configurations of widely-used emitter follower circuits.

The emitter follower circuit shown in FIG. 9 has npn transistor Q101 and resistor R101.

The npn transistor Q101 is connected to supply voltage line $V_{CC}$ by its collector, and its emitter is connected to ground line G via resistor R101. In addition, the output voltage of amplification circuit AMP101 of the previous stage is input to its base.

In the case of the emitter follower circuit shown in FIG. 9, the base of npn transistor Q101 is used as input, and the emitter of npn transistor Q101 is used as output.

When the potential of the output becomes lower than the potential of the input, and the potential difference becomes greater than the forward voltage of the pn junction, the emitter current of npn transistor Q101 increases suddenly, and a current flows from the emitter to the load (series circuit comprising capacitor CL and resistor RL in the case of the example shown in FIG. 9). When the difference between the potentials of the output and the input becomes smaller than the forward voltage of the pn junction as capacitor CL of the load is charged by said current, the emitter current of npn transistor Q101 decreases to stop the output of current to the load.

In addition, if the output acquires a higher potential than the input, npn transistor Q101 turns off to pull a current into resistor R101 from the load. When the potential of the output becomes lower than that of the input to the extent that the forward voltage of the pn junction as the electric charge in capacitor CL is discharged by said pulled-in current, the emitter current of npn transistor Q101 charges capacitor CL in the aforementioned manner to restrain the output voltage from dropping.

As such, a voltage obtained by shifting the input voltage by the forward voltage of the pn junction is constantly generated at the output of the emitter follower circuit. Therefore, the gain with respect to an AC voltage signal is almost "1," and the output signal becomes in-phase with the input signal.

The emitter follower circuit shown in FIG. 10 is provided with npn transistor Q102 in addition to a configuration (npn transistor Q101 and resistor R101) similar to that of the emitter follower circuit shown in FIG. 9.

The npn transistor Q102 is inserted between the emitter of npn transistor Q101 and resistor R101, and a prescribed bias voltage is supplied to its base by bias supply circuit B101.

The npn transistor Q102 is a constant current circuit for letting prescribed bias current Ibs flow between the emitter of npn transistor Q101 and ground line G. A current can be pulled in from the load as long as said bias current Ibs is not exceeded.

The emitter follower circuits shown in FIG. 9 and FIG. 10 are problematic in that their capability for sending out current from supply voltage line $V_{CC}$ to the load is lower than their capacity to pull a current into ground line G from the load. That is, while a large current can be supplied through npn transistor Q101 when the current is to be sent out to the load, the level of the current is restricted by the constant current circuit, for example, when the current is to be pulled in from the load. Because the speed of capacitor discharge is restricted when the pulled-in current is restricted, the output current fails to follow changes in the input voltage when the capacitor has a large capacitance or when the signal frequency is high, and the waveform ends up being distorted.

FIG. 11 consists of graphs showing example output voltage waveforms of conventional emitter follower circuits. The signal frequency is approximately 500 kHz in FIG. 11 (A), and it is approximately 50 MHz in FIG. 11 (B). As can be understood by looking at the part surrounded by the dotted line in FIG. 11 (B), when the frequency is increased from 500 kHz to 50 MHz, the output voltage begins to fail to follow changes in the input voltage during the period in which current is pulled in from the load, and the waveform ends up being distorted.

In order to correct said distortion of the output waveform, bias current Ibs, applied between the emitter of npn transistor Q101 and ground line G, should be increased. However, if bias current Ibs is increased, bias current Ibs flows at all times regardless of the presence of the load, resulting in the problem of increased power consumption.

The present invention was created in light of such situation, and its objective is to present a buffer circuit by which the load can be driven at high speed while restraining an increase in power consumption.

SUMMARY OF THE INVENTION

In order to achieve the aforementioned objective, the buffer circuit of the present invention is provided with a first transistor that regulates a current flowing from a first node to a second node in accordance with an input signal; a second transistor that regulates a current flowing from the aforementioned second node to a reference potential in accordance with a bias voltage supplied to it; a current detection circuit which detects the current input to the aforementioned first transistor via the aforementioned first node; and a bias control circuit that regulates the aforementioned bias voltage in such a manner that the current of the aforementioned second transistor is decreased in accordance with an increase in the current detected by the aforementioned current detection circuit, and the current of the aforementioned second transistor is increased in accordance with a decrease in said detected current in order to regulate the aforementioned bias voltage; wherein, it outputs a signal corresponding to the aforementioned input signal from the aforementioned second node.

According to the present invention described above, the current input to the aforementioned first transistor via the aforementioned first node is detected at the aforementioned current detection circuit. At the aforementioned bias control circuit, the aforementioned bias voltage is regulated so as to decrease the current of the aforementioned second transistor in accordance with an increase in said detected current, and the aforementioned bias voltage is regulated so as to increase the current of the aforementioned second transistor in accordance with a decrease in said detected current.

Thus, because the current flowing in the aforementioned second transistor decreases as the current flowing in the aforementioned first transistor increases, the current flowing from the aforementioned first transistor to the load increases; and because the current flowing in the aforementioned second transistor increases as the current flowing in the aforementioned first transistor decreases, the current flowing from the load to the aforementioned second transistor increases. That is, either when the current flows from the aforementioned first transistor to the load or when the current flows from the load to the aforementioned second transistor, the transient current to the load can be increased by regulating the aforementioned bias voltage. In addition, wasteful current flowing through the aforementioned first transistor and the aforementioned second transistor can be reduced compared to a method in which the current of the aforementioned second transistor is set constantly high, independent of the current of the aforementioned first transistor.

Furthermore, the aforementioned current detection circuit may include an impedance circuit inserted in a wiring line used to input the current to the aforementioned first transistor via the aforementioned first node, and the aforementioned bias control circuit may include a series circuit comprising multiple capacitors and used to divide an AC voltage signal generated at the aforementioned impedance circuit and superimpose it on the aforementioned bias voltage.

In such case, the aforementioned bias control circuit may include a resistor or an inductor connected between the node for outputting the voltage signal divided by the aforementioned capacitor series circuit and the node to which the aforementioned bias voltage is supplied.

Alternatively, the aforementioned current detection circuit may include a first inductor inserted in a wiring line used to input the current to the aforementioned first transistor via the aforementioned first node, and the aforementioned bias control circuit may include a second inductor joined magnetically with the aforementioned first inductor so as to generate a voltage in accordance with the current flowing in the aforementioned first inductor and superimpose it on the aforementioned bias voltage.

In such a case, the aforementioned second inductor may be connected between the node to which the aforementioned bias voltage is supplied and a control terminal of the aforementioned first transistor.

In addition, the aforementioned first transistor may be a first-conductance-type bipolar transistor connected to the aforementioned first node by its collector and to the aforementioned second node by its emitter, and the aforementioned input signal is input to its base; the aforementioned second transistor may be a first-conductance-type bipolar transistor connected to the aforementioned second node by its collector, and the bias voltage regulated by the aforementioned bias control circuit is input to its base.

According to the present invention, a load can be driven at high speed and at low power consumption without letting a large current flow into any transistor constantly.

REFERENCE NUMERALS AND SYMBOLS AS SHOWN IN THE DRAWINGS

In the figures, 1 represents a current detection circuit; 2 represents a bias control circuit; Q1, Q1-1, Q1-2, Q2, Q2-1, and Q2-2 represent npn transistors; R1, R1-1, R1-2, R2, R2-1, R2-2, R3, R3-1, and R3-2 represent resistors; B1 represents a bias supply circuit; C1, C1-1, C1-2, C2, C2-1, and C2-2 represent capacitors; and L1 and L2 represent inductors.

DESCRIPTION OF THE EMBODIMENTS

Three embodiments of the present invention will be explained below in reference to figures.

First Embodiment

Figure 1:
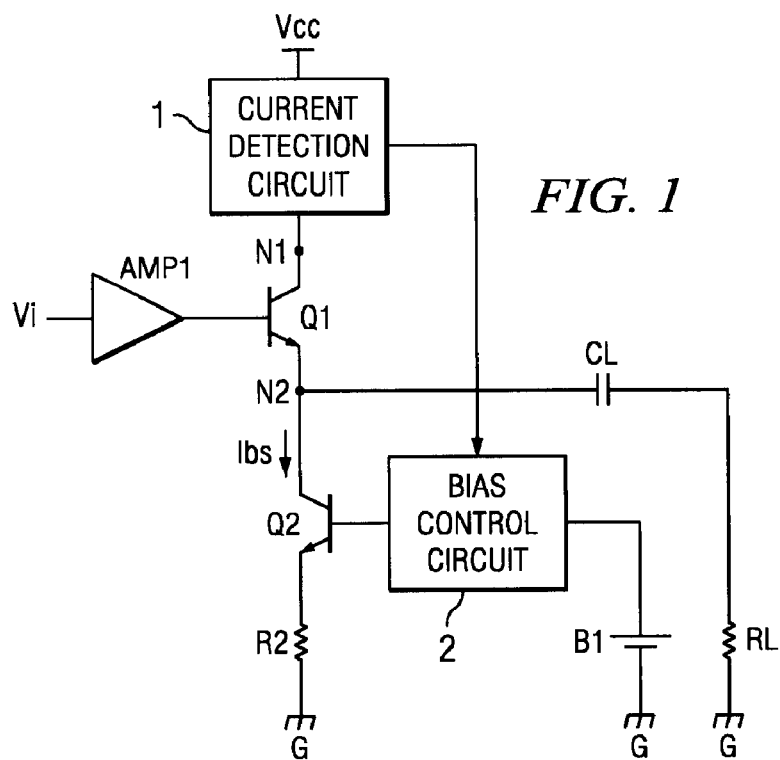
FIG. 1 is a diagram showing an example configuration of a buffer circuit pertaining to a first embodiment of the present invention.

FIG. 1 is a diagram showing an example configuration of a buffer circuit pertaining to a first embodiment of the present invention.

The buffer circuit shown in FIG. 1 has npn transistors Q1 and Q2, current detection circuit 1, bias control circuit 2, resistor R2, and bias supply circuit B1.

Furthermore, npn transistor Q1 is an embodiment of the first transistor of the present invention.

The npn transistor Q2 is an embodiment of the second transistor of the present invention.

Current detection circuit 1 is an embodiment of the current detection circuit of the present invention.

Bias control circuit 2 is an embodiment of the bias control circuit of the present invention.

The npn transistor Q1 regulates a current flowing from node N1 to node N2 in accordance with a signal input to its base.

That is, npn transistor Q1 is connected to node N1 by its collector and to node N2 by its emitter, and an output signal of amplification circuit AMP1 of the previous stage is input to its base.

The npn transistor Q2 regulates current flowing from node N2 to ground line G in accordance with a bias voltage supplied to its base.

That is, npn transistor Q2 is connected to node N2 by its collector and to ground line G by its emitter via resistor R2, and a bias voltage is input to its base.

Current detection circuit 1 detects current input from supply voltage line $V_{CC}$ to npn transistor Q1 via node N1.

Bias supply circuit B1 generates a DC bias voltage to be supplied to the base of npn transistor Q2.

Bias control circuit 2 regulates the bias voltage generated by bias supply circuit B1 according to the current detection result of current detection circuit 1 and inputs it to the base of npn transistor Q2.

That is, bias control circuit 2 controls the base voltage of npn transistor Q2 in such a manner that it decreases bias current Ibs of npn transistor Q2 in accordance with an increase in the current detected by current detection circuit 1, and bias current Ibs of npn transistor Q2 is increased in accordance with a decrease in said detected current.

More specifically, the base voltage of npn transistor Q2 is decreased in accordance with an increase in current detected by current detection circuit 1, and the base voltage of npn transistor Q2 is increased in accordance with a drop in said detected current.

In addition, in the example shown in FIG. 1, a series circuit comprising capacitor CL and resistor RL is connected as a load between the emitter of npn transistor Q1 and ground line G.

Operation of the buffer circuit shown in FIG. 1 with the aforementioned configuration will be explained.

In the case of the buffer circuit shown in FIG. 1, the base of npn transistor Q1 is used as input, and the emitter of npn transistor Q1 is used as output.

When the potential of the output becomes lower than the potential of the input, and the potential difference becomes greater than the forward voltage of the pn junction, the emitter current of npn transistor Q1 increases suddenly, and current flows from the emitter to the load (capacitor CL and resistor RL). When the difference between the potentials of the output and the input becomes smaller than the forward voltage of the pn junction as capacitor CL of the load is charged by said current, the emitter current of npn transistor Q1 decreases to stop output of the current to the load.

In addition, if the output acquires a higher potential than the input, npn transistor Q1 turns off to pull a current into resistor R1 from the load. When the potential of the output becomes lower than that of the input to the extent of the forward voltage of the pn junction as the electric charge in capacitor CL is discharged by said pulled-in current, the emitter current of npn transistor Q1 charges capacitor CL in the aforementioned manner to restrain dropping of the output voltage.

Figure 9:
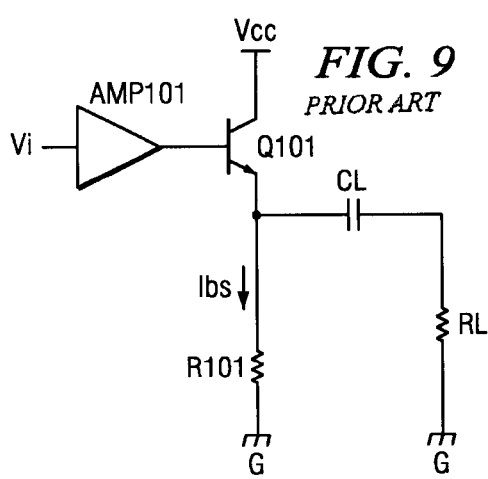
FIG. 9 is a first diagram showing an example configuration of a widely used emitter follower circuit.

As such, a voltage obtained by shifting the input voltage by the forward voltage of the pn junction is generated constantly at the output of the emitter follower circuit. Therefore, like the emitter follower circuits shown in FIG. 9 and FIG. 10, the gain with respect to an AC voltage signal is almost "1," and the output signal becomes in-phase with the input signal.

Furthermore, according to the aforementioned configuration, the current input to npn transistor Q1 via node N1 is detected by current detection circuit 1. At bias control circuit 2, the base voltage of npn transistor Q2 is regulated in such a manner that the current of npn transistor Q2 decreases in accordance with an increase in said detected current, and the current of npn transistor Q2 increases in accordance with a decrease in the detected current.

Thus, because the base voltage of npn transistor Q1 increases in accordance with the output signal of amplification circuit AMP 1, and the current flowing in npn transistor Q2 decreases as the current of npn transistor Q1 increases, the current sent out from npn transistor Q1 to the load (capacitor CL and resistor RL) increases. In addition, because the current flowing in npn transistor Q2 increases as the current flowing in npn transistor Q1 decreases, the current pulled into npn transistor Q2 from the load increases. That is, either when the sent-out current flows from npn transistor Q1 to the load or when the pulled-in current flows from the load to npn transistor Q2, the transitional current that can flow to the load can be increased by regulating the bias voltage using bias control circuit 2. In particular, the capability for transient current flow can be improved. As a result, even when load capacitor CL has a large capacitance or when the frequency is high, the output voltage can quickly follow a change in the input voltage (particularly change that takes place during the pulling-in of the current), so that distortion of the waveform of the output voltage can be restrained effectively.

In addition, in the case of the method in which bias current Ibs of npn transistor Q2 is set high constantly, independent of the current of npn transistor Q1, in order to increase the pulled-in current from the load, because a very large current flows constantly through npn transistor Q1 and npn transistor Q2, power is consumed wastefully. According to the buffer circuit shown in FIG. 1, however, because bias current Ibs of npn transistor Q2 is decreased/increased as the current of npn transistor Q1 increases/decreases, the pulled-in current from the load can be increased without a large constant current flow, so that an increase in wasteful power consumption can be restrained.

Second Embodiment

Next, a second embodiment of the present invention will be described.

Figure 2:
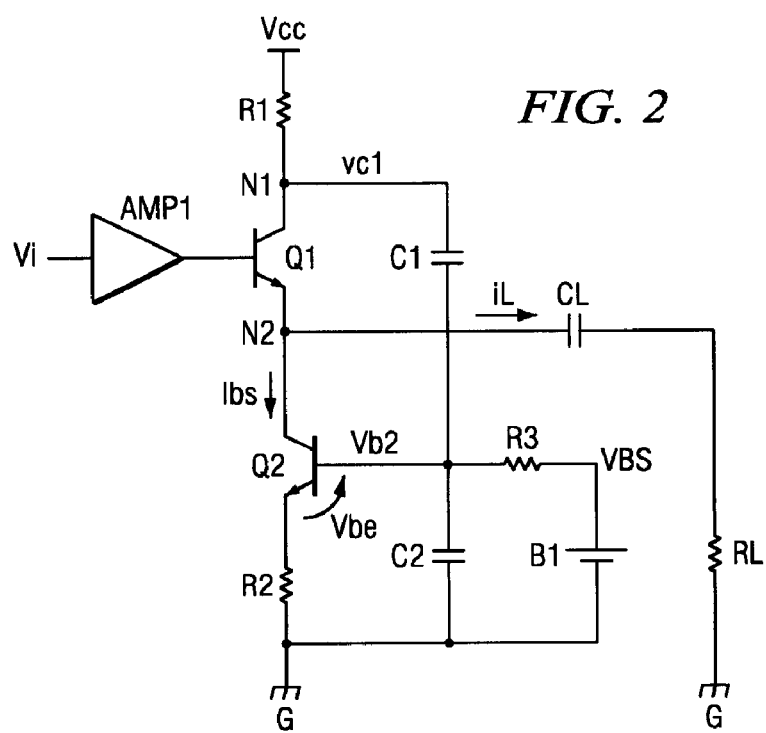
FIG. 2 is a diagram showing an example configuration of a buffer circuit pertaining to a second embodiment of the present invention.

FIG. 2 is a diagram showing an example configuration of a buffer circuit pertaining to a second embodiment of the present invention.

The buffer circuit shown in FIG. 2 has npn transistors Q1 and Q2, resistors R1 through R3, capacitors C1 and C2, and bias supply circuit B1.

Furthermore, resistor R1 is an embodiment of the impedance circuit of the present invention.

The circuit that contains resistor R3 and capacitors C1 and C2 is an embodiment of the bias control circuit of the present invention.

The series circuit comprising capacitors C1 and C2 is an embodiment of the capacitor series circuit of the present invention.

Resistor R3 is an embodiment of the resistor of the present invention.

Resistor R1 is connected between supply voltage line $V_{CC}$ and node N1.

Capacitor C1 is connected between the base of npn transistor Q2 and node N1.

Capacitor C2 is connected between the base of npn transistor Q2 and ground line G.

Resistor R3 is connected between the base of npn transistor Q2 and the bias voltage output terminal of bias supply circuit B1.

Resistor R2 and npn transistors Q1 and Q2 have the same connection relationship as that of the constituents assigned with the same symbols in FIG. 1.

If the AC element of the voltage generated at resistor R1 is denoted as "vr1," AC element Vb2 of the base voltage of npn transistor Q2 can be approximated in the manner expressed by the following equation.

$$vb2 = vr1 \times \{c1/(c1+c2)\} \quad (1);$$

Here, in Equation (1), "c1" represents the value of the capacitance of capacitor C1, and "c2" represents the value of the capacitance of capacitor C2.

As is clear also from said equation, a signal obtained by dividing AC signal vr1 of the voltage signal generated at resistor R1 using the series circuit comprising capacitors C1 and C2 is input to the base of npn transistor Q2.

As such, according to the buffer circuit shown in FIG. 2, the AC voltage generated at resistor R1 is divided by the series circuit comprising capacitors C1 and C2 in accordance with the current flowing in npn transistor Q1, is superimposed on the DC bias voltage generated by bias supply circuit B1, and is input to the base of npn transistor Q2.

When the current of npn transistor Q1 increases as the base voltage of npn transistor Q1 increases in accordance with the output signal of amplification circuit AMP1, the current flowing in resistor R1 increases, and the potential of node N1 drops. Accordingly, the base voltage of npn transistor Q2 as the junction of capacitors C1 and C2 also drops, and the current of npn transistor Q2 decreases. As a result, the current sent from npn transistor Q1 to the load increases. In addition, because the current flowing in resistor R1 decreases as the current flowing in npn transistor Q1 decreases, and the potential of node N1 rises, the base voltage of npn transistor Q2 increases, and the current of npn transistor Q2 increases in contrast to the above. As a result, the current pulled from the load into npn transistor Q2 increases. That is, either when the sent-out current flows from npn transistor Q1 to the load or when the pulled-in current flows from the load to npn transistor Q2, the transient current that can flow to the load can be increased. Therefore, even when load capacitor CL has a large capacitance or a high frequency, the output voltage can quickly follow a change in the input voltage, so that distortion of the waveform of the output voltage, which is particularly likely during the current pull-in period, can be restrained effectively.

In addition, according to the buffer circuit shown in FIG. 2, because the DC element of bias current Ibs flowing in npn transistor Q2 is kept constant in accordance with the DC bias voltage of bias supply circuit B1, there is no need to set said DC element high in order to increase the transitional load pulled-in current, so that an increase in power consumption attributable to a constant bias current can be restrained.

Figure 10:
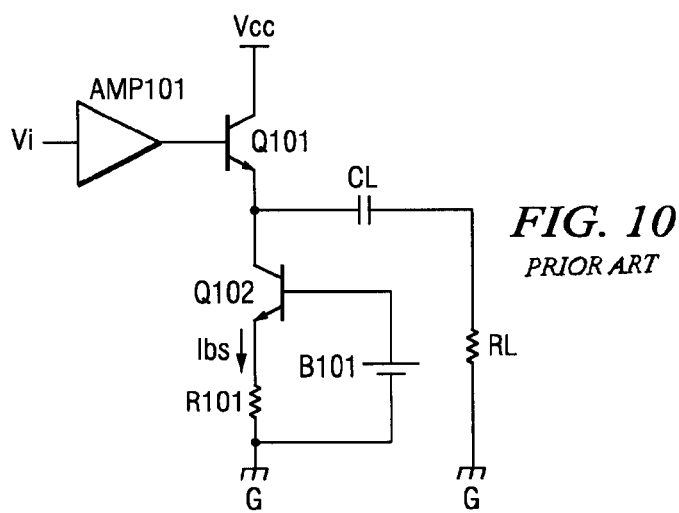
FIG. 10 is a second diagram showing an example configuration of a widely used emitter follower circuit.
Figure 11A:
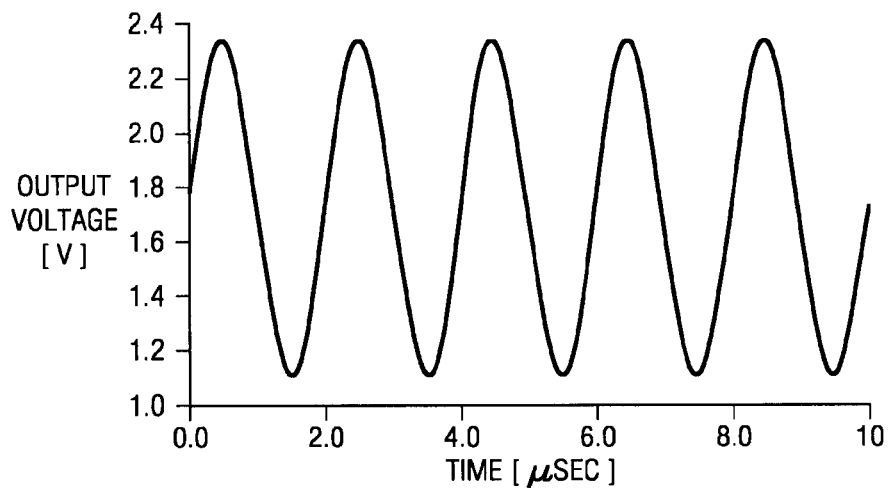
FIG. 11 consists of graphs showing example output voltage waveforms of the conventional emitter follower circuits.
Figure 11B:
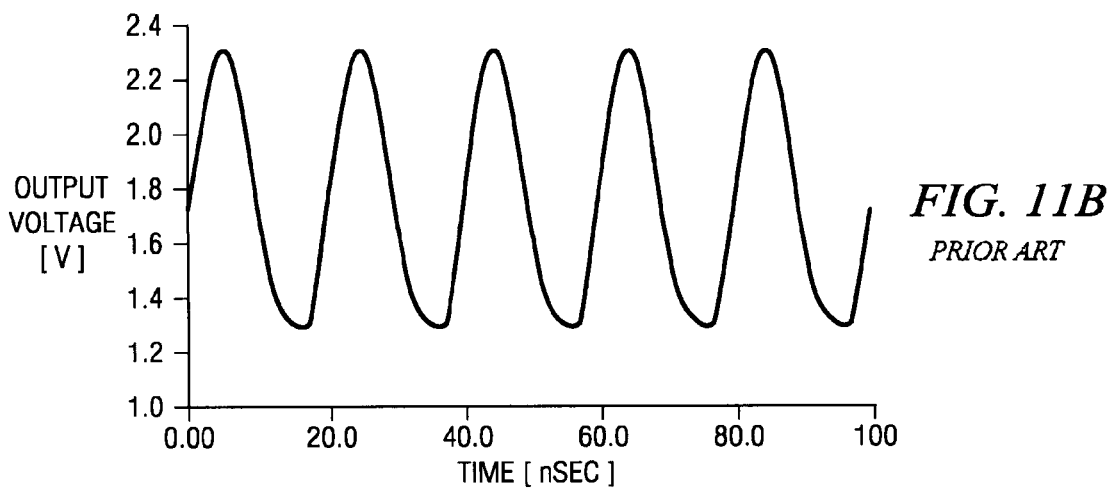

In addition, because the buffer circuit shown in FIG. 2 has a very simple configuration that can be realized by adding resistor R for current detection and two capacitors to the circuit shown in FIG. 10, for example, the response characteristic can be improved significantly while restraining increase in the circuit area.

As such, because the buffer circuit pertaining to the present invention has an excellent response performance, and because it allows restraint in power consumption while keeping the circuit area small, it can be nicely applied to a TV tuner circuit in a portable telephone set requiring high speed and low power consumption and to a circuit used to drive a capacitive load at high speed, for example, a driver circuit that needs to drive a switch quickly.

Figure 3:
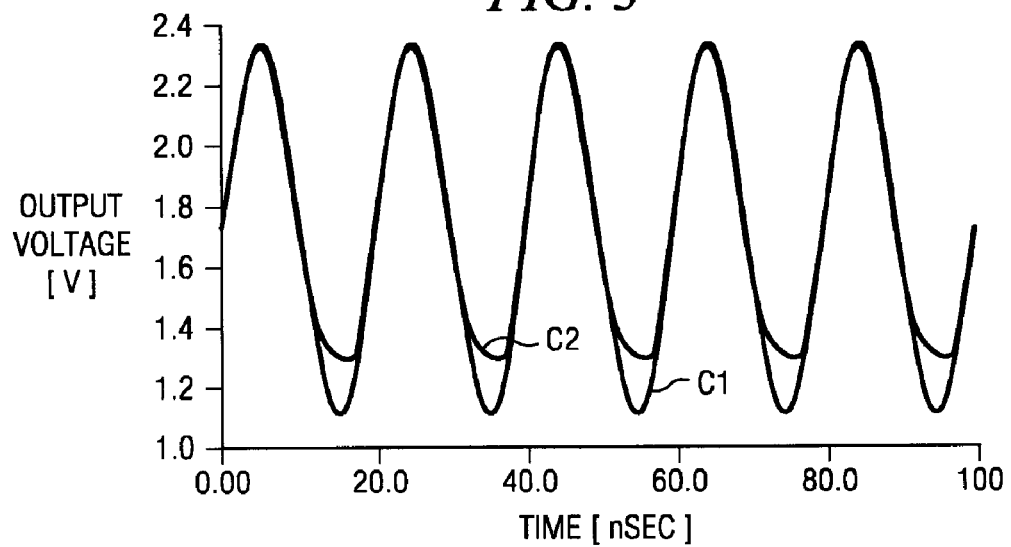
FIG. 3 is a graph showing an example of the output voltage waveform of the buffer circuit shown in FIG. 2.

FIG. 3 is a graph showing an example of the output voltage waveform of the buffer circuit shown in FIG. 2, and it serves as a comparative example with respect to a conventional emitter follower circuit.

In FIG. 3, curve C1 represents the output voltage waveform of the buffer circuit pertaining to the present embodiment, and curve C2 represents the output voltage waveform of a conventional emitter follower circuit. Upon comparison it is clear that, in the case of the buffer circuit pertaining to the present embodiment, because the capability to pull in transient current from the load can be improved, the waveform distortion observed in the conventional circuit can be corrected.

Next, embodiments of the buffer circuit shown in FIG. 2 will be described.

Figure 4:
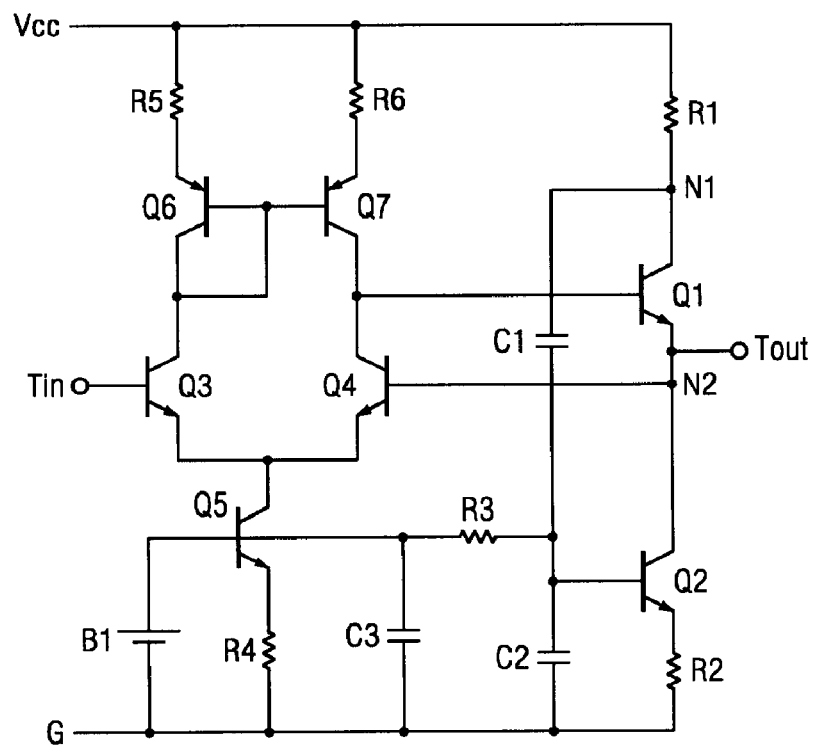
FIG. 4 is a first diagram showing an example of the buffer circuit shown in FIG. 2.

FIG. 4 is a diagram showing an example unity gain amplification circuit in which the buffer circuit shown in FIG. 2 is provided at the output stage.

The amplification circuit shown in FIG. 4 has a buffer circuit with the same configuration (Q1, Q2, R1 through R3, C1, C2, and B1) as that of the circuit shown in FIG. 2 along with npn transistors Q3 through Q5, pnp transistors Q6 and Q7, resistors R4 through R6, and capacitor C3, which constitute a differential amplification circuit.

The npn transistors Q3 and Q4 are connected by their emitters, and their junction is connected to the collector of npn transistor Q5. npn transistor Q5 is connected by its emitter to ground line G via resistor R4, and a DC bias voltage of bias supply circuit B1 is input to its base.

The pnp transistors Q6 and Q7 are connected by their bases, and their junction is connected to the collector of pnp transistor Q6. The collector of pnp transistor Q6 is connected to the collector of npn transistor Q3, and its emitter is connected to supply voltage line $V_{CC}$ via resistor R5. The collector of pnp transistor Q7 is connected to the collector of npn transistor Q4, and its emitter is connected to supply voltage line $V_{CC}$ via resistor R6.

The junction of the collectors of pnp transistor Q7 and npn transistor Q4 is connected to the base of npn transistor Q1. In addition, node N2 is connected to the base of npn transistor Q4.

Capacitor C3 is connected in parallel to bias supply circuit B1, whereby it prevents change in the DC bias voltage.

Furthermore, bias supply circuit B1 is shared by the buffer circuit of the output stage and the provided differential amplification circuit of the previous stage.

According to the amplification circuit shown in FIG. 4, when an input signal is supplied to the base of npn transistor Q3 from input terminal Tin, a signal with almost the same voltage waveform is output to output terminal Tout from of N2.

That is, when output terminal Tout has a potential difference with respect to input terminal Tin, said potential difference is amplified by the differential amplification circuit configured in the aforementioned manner and fed back to the base of npn transistor Q1 in order to change the voltage of output terminal Tout to reduce said potential difference. Assuming that the differential amplification circuit has a sufficiently large gain, the potential difference between terminal Tin and terminal Tout becomes almost zero as a result of said feedback control, and the voltage waveform of the output signal becomes almost identical to that of the input signal.

Figure 5:
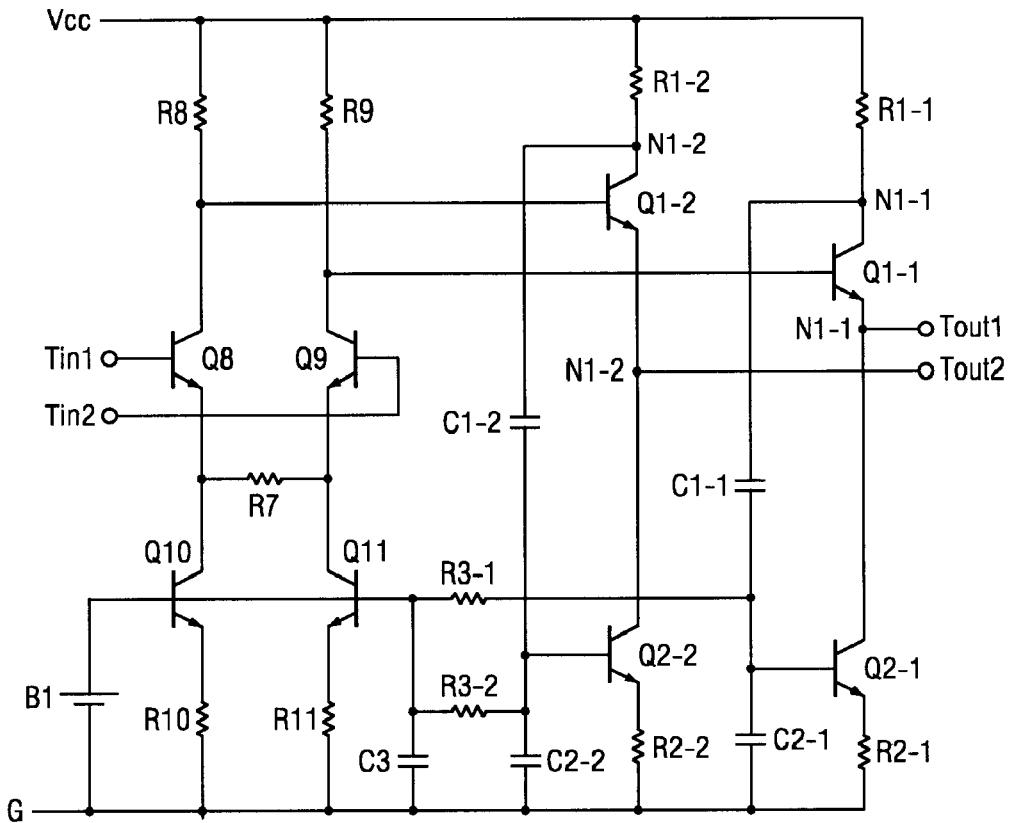
FIG. 5 is a second diagram showing an example of the buffer circuit shown in FIG. 2.

FIG. 5 is a diagram showing an example in which two units of the buffer circuit shown in FIG. 2 are mounted at the output stage.

The differential amplification circuit shown in FIG. 5 has buffer circuit BUF1 with a similar configuration (Q1-1, Q2-1, R1-1 through R3-1, C1-1, C2-1, and B1) to that of the circuit shown in FIG. 2 and buffer circuit BUF2 (Q1-2, Q2-2, R1-2 through R3-2, C1-2, C2-2, and B1) along with npn transistors Q8 through Q11, resistors R7 through R11, and capacitor C3, which constitute a differential amplification circuit.

The npn transistors Q8 and Q9 are connected to each other by their emitters via resistor R7. The npn transistor Q8 is connected to supply voltage line $V_{CC}$ by its collector via resistor R8, to input terminal Tin1 by its base, and to the collector of npn transistor Q10 by its emitter. The npn transistor Q9 is connected to supply voltage line $V_{CC}$ by its collector via resistor R9, to input terminal Tin2 by its base, and to the collector of npn transistor Q11 by its emitter.

The npn transistors Q10 and Q11 are connected to ground line G by their emitters via resistors R10 and R11, respectively, and a DC bias voltage of bias supply circuit B1 is input to their bases.

The collector of npn transistor Q8 is connected to the base of npn transistor Q1-2, and the collector of npn transistor Q9 is connected to the base of npn transistor Q1-1.

Capacitor C3 is connected in parallel to bias supply circuit B1 to prevent change in the DC bias voltage.

Furthermore, bias supply circuit B1 is shared by the two buffer circuits (BUF1 and BUF2) of the output stage and the differential amplification circuit of the previous stage.

According to the amplification circuit shown in FIG. 5, when differential signals are input to input terminals Tin1 and Tin2, amplified differential signals are generated at output terminal Tout1, which is connected to node N1-1, and output terminal Tout2, which is connected to node N1-2.

That is, when the differential signals are input to input terminals Tin1 and Tin2, said differential signals are amplified by the differential amplification circuit configured in the aforementioned manner and output from the 2 collectors of npn transistors Q8 and Q9. The amplified differential signals are output to output terminals Tout1 and Tout2 via the 2 buffer circuits (BUF1 and BUF2) of the output stage and supplied to the load at a low impedance.

In the case of the buffer circuit shown in FIG. 2, the junction of capacitors C1 and C2 connected in series between node N1 and ground line G is connected to the base of npn transistor Q2 in order to divide the AC voltage signal (that is, the signal indicating the change in the current of npn transistor Q1) and feed it back to the base of npn transistor Q2. In consideration of the point that the voltage signal fed back to the base of npn transistor Q2 is AC, the connections of capacitors C1 and C2 may be altered in the ways shown in FIG. 6 and FIG. 7.

Figure 6:
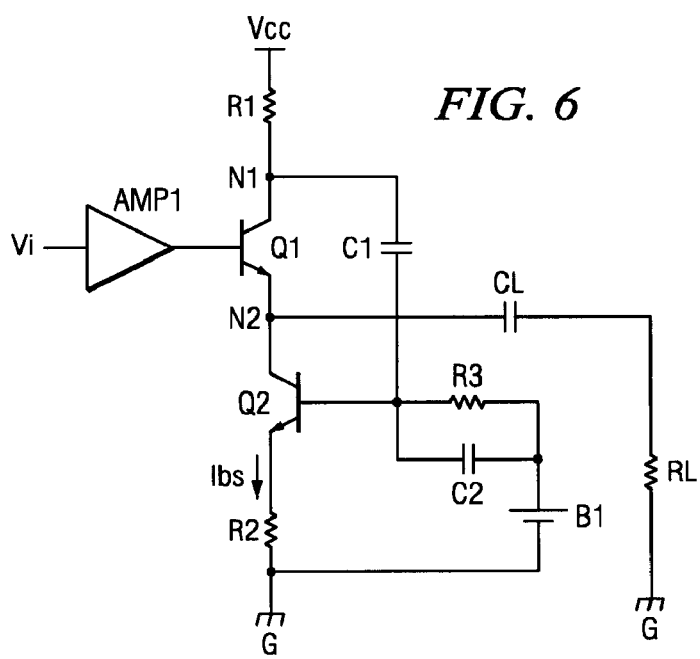
FIG. 6 is a first diagram showing a modification example of the buffer circuit shown in FIG. 2.
Figure 7:
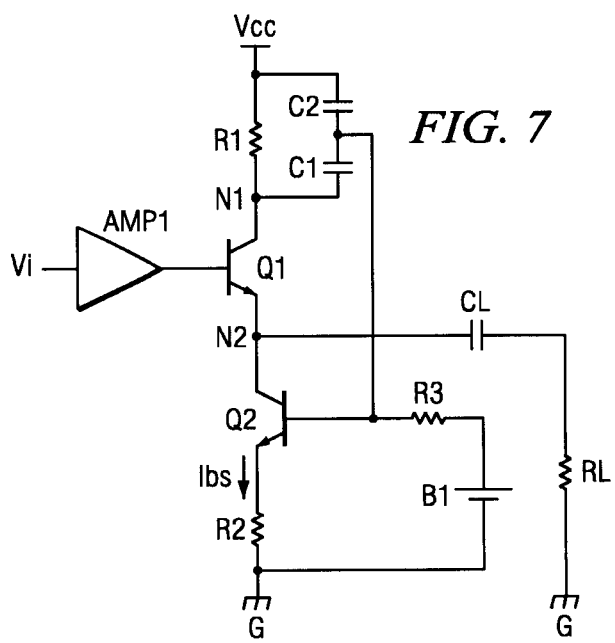
FIG. 7 is a second diagram showing a modification example of the buffer circuit shown in FIG. 2.

In the case of the buffer circuit shown in FIG. 6, the connection between capacitor C2 and ground line G in the buffer circuit shown in FIG. 2 is cut off, and said connection is reconnected to the DC bias voltage output terminal of bias supply circuit B1. In the case of the buffer circuit shown in FIG. 7, said connection is reconnected to supply voltage line $V_{CC}$.

In either circuit, because a divided signal of the AC voltage signal generated at resistor R1 is generated at the junction of capacitors C1 and C2, the same effect as that of the circuit shown in FIG. 2 can be attained.

Third Embodiment

A third embodiment of the present invention will be described next.

Figure 8:
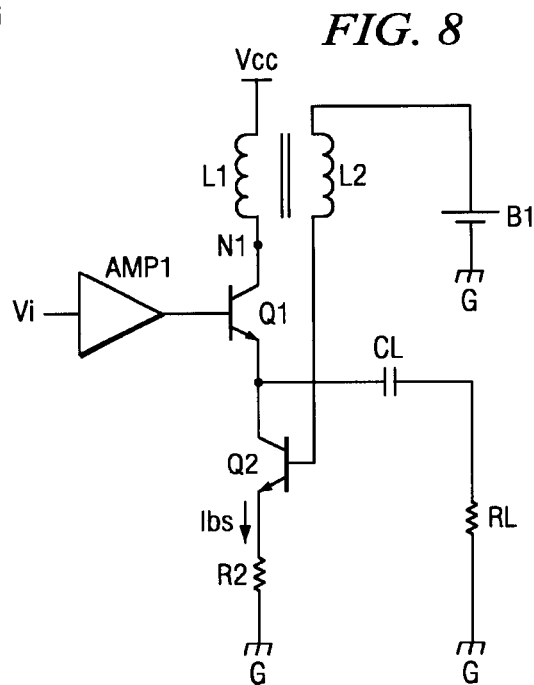
FIG. 8 is a diagram showing an example configuration of a buffer circuit pertaining to a third embodiment of the present invention.

FIG. 8 is a diagram showing an example configuration of a buffer circuit pertaining to a third embodiment of the present invention.

The buffer circuit shown in FIG. 8 has npn transistors Q1 and Q2, resistor R2, inductors L1 and L2, and bias supply circuit B1.

Furthermore, inductor L1 is an embodiment of the first inductor of the present invention.

Inductor L2 is an embodiment of the second inductor of the present invention.

Inductor L1 is inserted in a wiring line used to input a current from supply voltage line $V_{CC}$ to npn transistor Q1 via node N1.

Inductor L2 is joined magnetically with inductor L1, whereby it generates a voltage corresponding to the current flowing in inductor L1, superimposes it on the DC bias voltage of bias supply circuit B1, and supplies it to the base of npn transistor Q2. Inductor L2 is connected between the bias voltage output terminal of bias supply circuit B1 and the base of npn transistor Q2, whereby it decreases the base voltage of npn transistor Q2 when the sent-out current from npn transistor Q1 to the load has increased and generates a voltage to increase the base voltage of npn transistor Q2 when said sent-out current has decreased.

Resistor R2 and npn transistors Q1 and Q2 have the same connection relationship as that of the constituents assigned with the same symbols in FIG. 1.

According to the buffer circuit shown in FIG. 8, a current corresponding to the current flowing in npn transistor Q1 is generated at inductor L2 which is joined magnetically with inductor L1, and the voltage of said inductor L2 is superimposed on the DC bias voltage of bias supply circuit B1 and input to the base of npn transistor Q2.

When the current of npn transistor Q1 increases as the base voltage of npn transistor Q1 increases in accordance with the output signal of amplification circuit AMP1, a voltage with a polarity that decreases the base voltage of npn transistor Q2 is generated at inductor L2, so that the current of npn transistor Q2 decreases. As a result, the current sent to the load from npn transistor Q1 increases. In addition, when the current flowing in npn transistor Q1 decreases, in contrast to the above, a voltage that increases the base voltage of npn transistor Q2 is generated at inductor L2, so that the current of npn transistor Q2 increases. As a result, the current pulled into npn transistor Q2 from the load increases. That is, either when sent-out current flows from npn transistor Q1 to the load or when pulled-in current flows from the load to npn transistor Q2, the transitional current which can flow to the load can be increased. Therefore, even when load capacitor CL has a large capacitance or when the frequency is high, the output voltage can quickly follow a change in the input voltage, so that distortion of the waveform of the output voltage can be restrained.

In addition, according to the buffer circuit shown in FIG. 8, because the DC element of bias current Ibs flowing in npn transistor Q2 is kept constant in accordance with the DC bias voltage of bias supply circuit B1, and there is no need to set said DC element high in order to increase the transitional load pulled-in current, an increase in power consumption can be restrained.

Furthermore, according to the buffer circuit shown in FIG. 8, resistor R1 and resistor R3 used in the circuit shown in FIG. 2 can be eliminated, so that the configuration can be further simplified.

Although the present invention has been described in reference to several embodiments, the present invention is not restricted to the aforementioned embodiments, and it includes many variations.

For example, although resistor R1 is used to detect the current of npn transistor Q1 in the buffer circuit shown in FIG. 2, this does not impose any restriction; and it may be replaced by another circuit, for example, an inductor, which outputs a signal corresponding to a change in the current of npn transistor Q1.

In addition, in the case of the buffer circuit shown in FIG. 2, although resistor R3 is inserted between the junction of capacitors C1 and C2 and the bias voltage supply terminal so as to superimpose an AC element on the DC bias voltage input to npn transistor Q2 through capacitors C1 and C2, the present invention is not restricted to this. For example, an inductor that demonstrates a sufficiently high impedance at the frequency of the AC element to be superimposed may be utilized in place of resistor R3.

In addition, although the buffer circuits utilize npn transistors in the aforementioned respective embodiments, this does not impose a restriction, and the present invention can be applied also to a circuit that utilizes pnp transistors so as to output a negative voltage.

In addition, the transistor type is not restricted to a bipolar transistor, and other transistors of various kinds (for example, field effect transistors) may be utilized also.

The invention claimed is:

1. A buffer circuit comprising:
a first transistor that regulates a current flowing from a first node to a second node in accordance with an output signal of an amplification circuit of a previous stage applied as an input signal to a control terminal of the first transistor;
a second transistor that regulates a current flowing from the second node to a reference potential in accordance with a bias voltage applied to a control terminal of the second transistor;
a current detection circuit which detects the current input to the first transistor via the first node, wherein the current detection circuit includes a first inductor inserted in a path used to input current to the first transistor via the first node; and
a bias control circuit that regulates the bias voltage, responsive to the current detected by the current detection circuit such that the current of the second transistor is decreased in accordance with an increase in the current detected by the current detection circuit, and the current of the second transistor is increased in accordance with a decrease in the current detected by the current detection circuit, wherein the bias control circuit includes a second inductor joined magnetically with the first inductor so as to generate a voltage in accordance with the current flowing in the first inductor and so as to superimpose it on the bias voltage, and wherein an output signal corresponding to the input signal is output from the second node.

2. The buffer circuit of claim 1, in which the a second inductor is connected between a node to which the bias voltage is supplied and the control terminal of the second transistor.

3. An apparatus comprising:
an amplifier having an output terminal;
a current regulator that is coupled to the output terminal of the amplifier and that is coupled to a load at an output node;
a first inductor that receives a first input voltage and that is coupled to the current regulator;
a second inductor that receives a second input voltage and that is coupled to the current regulator, wherein the second inductor is magnetically coupled to the first inductor so that a current through the first inductor generates a voltage that is superimposed on the second voltage.

4. The apparatus of claim 3, wherein current regulator further comprises:
a first transistor having a control electrode, a first passive electrode, and a second passive electrode, wherein the first transistor is coupled to the output terminal of the amplifier at its control electrode and is coupled to the first inductor at its first passive electrode; and
a second transistor having control electrode, a first passive electrode, and a second passive electrode, wherein the second transistor is coupled to the second inductor an its control electrode and is coupled to the second passive electrode of the first transistor and the output node at its first passive electrode.

5. The apparatus of claim 4, wherein the first transistor further comprises a bipolar NPN transistor.

6. The apparatus of claim 4, wherein the second transistor further comprises a bipolar NPN transistor.

7. The apparatus of claim 4, wherein the current regulator further comprises a resistor coupled between the second passive electrode of the second transistor and ground.

* * * * *